(12) United States Patent
Hartmann

(10) Patent No.: US 6,525,349 B2
(45) Date of Patent: Feb. 25, 2003

(54) HETEROJUNCTION BIPOLAR TRANSISTOR WITH TENSILE GRADED CARBON-DOPED BASE LAYER GROWN BY MOCVD

(75) Inventor: Quesnell Hartmann, Champaign, IL (US)

(73) Assignee: Epiworks, Inc., Champaign, IL (US)

(*) Notice: Subject to any disclaimer, the term of this patent is extended or adjusted under 35 U.S.C. 154(b) by 44 days.

(21) Appl. No.: 09/883,636

(22) Filed: Jun. 18, 2001

(65) Prior Publication Data

US 2002/0190272 A1 Dec. 19, 2002

(51) Int. Cl.$^7$ ............ H01L 29/737; H01L 29/201; H01L 29/207

(52) U.S. Cl. ............ 257/197; 257/198; 257/201; 257/609; 257/615

(58) Field of Search ............ 257/197, 198, 257/201

(56) References Cited

U.S. PATENT DOCUMENTS

| | | | | |
|---|---|---|---|---|
| 5,349,201 A | * | 9/1994 | Stawchina et al. | 257/197 |
| 5,477,066 A | * | 12/1995 | Nakanishi | 257/197 |
| 5,717,228 A | * | 2/1998 | Matsuoka | 257/197 |
| 5,814,843 A | * | 9/1998 | Ohkubo | 257/197 |
| 5,903,018 A | * | 5/1999 | Shimawaki | 257/198 |
| 5,907,165 A | * | 5/1999 | Hamm et al. | 257/197 |
| 6,399,971 B1 | * | 6/2002 | Shigematsu et al. | 257/197 |

OTHER PUBLICATIONS

V. Drouot, M. Gendry, C. Santinelli, P. Viktorovitch, and G. Hollinger, "High Electron Mobility in Pseudomorphic Modulation–Doped InGaAs/InAlAs Heterostructures Achieved with Growth Interruptions," J. Appl. Physics 1995, pp. 1801–1812, vol. 77.

Manabu Mitsuhara, Matsuyuki Ogasawara, Hideo Sugiura, "Effect of Strain in the Barrier Layer on Structural and Optical Properties of Highly Strained InGaAs/InGaAl Multiple Quantum Wells," Elsevier Science B.V. 2000, Journal of Crystal Growth, pp. 463–470, vol. 210.

M. Gendry, V. Drouot, G. Hollinger, and S. Mahajan, "Effect of Surface Steps and Nonstoichiometry on Critical Thickness of Strained InGaAs Layers Grown by Molecular Beam Epitaxy on InAlAs/InP Heterostructures," Appl. Physics Lett. vol. 66 1995, pp. 40–42.

M. Gendry, L. Porte, and G. Hollinger, "Evidence for Inhomogeneous Growth Rates in Partially Relaxed InGaAs/InP Heterostructures," J. Appl. Phys. vol. 78 1995, pp. 3138–3143.

J.F. Damiencourt, J.L. Leclercq, M. Gendry, P. Regreny, and G. Hollinger, "High–Quality Fully Relaxed InGaAs Layers Grown on InP Using the Paramorphic Approach," Applied Physics Letters 1999, vol. 75, No. 23, pp. 3638–3640.

S. Jourba, M. Gendry, O. Marty, M. Pitaval, and G. Hollinger, "High–Quality Highly Strained InGaAs Quantum Wells Grown on InP Using (InAs) (GaAs) Fractional Monolayer Superlattices," Applied Physics Letters 1999, vol. 75, No. 2, pp. 220–222.

(List continued on next page.)

Primary Examiner—Gene M. Munson
(74) Attorney, Agent, or Firm—Banner & Witcoff, Ltd.

(57) ABSTRACT

A heterojunction bipolar transistor (HBT), having a substrate formed of indium phosphide (InP), and having emitter, base and collector layers formed over the substrate such that the base layer is disposed between the emitter and collector layers. The collector layer formed from InGaAs, and the collector layer being doped n-type. The emitter layer formed from InP, and the emitter layer being doped n-type. The base layer formed of indium gallium arsenide (InGaAs) and grown by MOCVD, the base layer being tensile strained and graded, and the base layer being doped p-type with carbon. A lattice mismatch, for at least a portion of the base layer, between the substrate and the base material is greater than 0.2%.

20 Claims, 3 Drawing Sheets

OTHER PUBLICATIONS

M. Gendry, V. Drouot, C. Santinelli, and G. Hollinger, "Critical Thicknesses of Highly Strained InGaAs Layers Grown on InP by Molecular Beam Epitaxy," Appl. Physics Lett. vol. 60, 1992, pp. 2249–2251.

S. Jourba, M. Gendry, P. Regreny, and G. Hollinger, "Highly Strained InGa–As/InP Quantum Wells Grown by Solid Source MBE for Applications in the 2–2.3 um Spectral Range," Elsevier Science B.V. 1999, Journal of Crystal Growth, pp. 1101–1104, vol. 201/202.

D.H. Woo, M.S. Oh, E.H. Koh, J.S. Yahng, S.H. Kim, and Y.D. Kim, "Strained InGaAs(P)/InP Multi–Quantum Well Structures Grown by Chemical–Beam Epitaxy," Elsevier Science B.V. 2000, Microelectric Engineering vol. 51–52, pp. 171–179.

Hyun–Soo Kim, Dae Kon Oh, In–Hoon Choi, "Effect of p–doping Profile on Performance of Strained InGaAs/InGaAsP Multiple Quantum Well Buried Heterostructure Laser Diodes with Fe– or p/n/p–doped InP Current Blocking Layer," Elsevier Science S.A. 2000, Materials Science and Engineering B77, pp. 202–206.

Q.J. Hartmann, D.A. Ahmari, M.T. Fresina, P.J. Mares, J.E. Baker, M. Feng, and G.E. Stillman, "InGaP/GaAs Drift HBTs with Strained InGaAs Base," Institute Physics Conference, Ser. No. 145: Chapter 5, pp. 637–642.

Takumi Nittono, Noriyuki Watanabe, Hiroshi Ito, Hirohiki Sugahara, Koichi Nagata and Osaake Nakajima, "Carbon and Indium Codoping in GaAs for Reliable AlGaAs/GaAs Heterojunction Bipolar Transistors," Japan J. Appl. Phys. 1994, vol. 33, pp. 6129–6135.

J.L. Benchimol, J. Mba, A.M. Duchenois, P. Berdaguer, B. Sermage, G. LeRoux, S. Blayac, M. Riet, J. Thuret, C. Gonzalez, P. Andre, "Improvement of CBE Grown InGaAs/Inp HBT's Using A Carbon Doped and Compositionally Graded Base," $11^{th}$ International Conference of Indium Phosphide and Related Materials—May 16–20, 1999, pp. 559–562.

"Mg–Doped Base GaAs/AlGaAs Heterojunction Bipolar Transistors Grown By Metalorganic Vapour Phase Epitaxy," Electronics Letters—Jan. 4, 1990, vol. 26, No. 1, pp. 58–59.

J.L. Song, C. Caneau, W.P. Hong and K.B. Chough, "Potentially High–Performance Carbon–Doped GaInP/GaAs Heterojunction Bipolar Transistors with Different Compositional Base Gradings," Electronics Letters—Mar. $31^{st}$, 1994, vol. 30, No. 7, pp. 605–606.

J. Weller, J. Jorke, K. Strohm, J.F. Luy, H. Kibbel, H.J. Herzog, and R. Sauer, "Asessment of Transport Parameters for the Design of High Speed Si/SiGe HBT's with Compositionally Graded Base," Elesvier Science 1998, Thin Solid Films 336, pp. 137–140.

G. Li, A. Neugroschel and C. T. Sah, "Quantitative Analysis of Si/GeSi/Si Heterojunction Bipolar Transistors with Linearly Graded Fe Profile," Electronics Letters—May $27^{th}$, 1999, vol. 35, No. 11, pp. 936–938.

Q.J. Hartmann, D.A. Ahmari, M.T. Fresina, P.J. Mares, J.E. Baker, M. Feng, and G.E. Stillman, "InGaP/GaAs Drift HBT's with Strained InGa1As Base," Inst. Phys. Conf. 1996, Ser. No. 145, Chapter 5, pp. 637–642.

J.L. Benchimol, J. Mba, B. Sermage, M. Riet, S. Blayac, P. Berdaguer, A.M. Duchenois, P. Andre, J. Thuret, C. Gonzalez, and A. Konczykowska, "Investigation of Carbon–Doped Base Materials Grown by CBE for Al–free InP HBT's," Elsevier Science B.V. 2000, Journal of Crystal Growth vol. 209, pp. 476–480.

C. Lugand, T. Benyattou, G. Guillot, T. Venet, M. Gendry, and G. Hollinger, "Type II Recombination and Band Offset Determination In A Tensile Strained InGaAs Quantum Well," Appl. Phye. Lett., vol. 70, 1997, pp. 3257–3259.

W. Strupinski, L. Dillner, J. Sass, K. Kosiel, J. Stake, M. Ingvarson, and R. Jakieta, "MOVPE Strain Layers—Growth and Application," Elsevier Science, B.V. 2000, Journal of Crystal Growth 221, pp. 20–25.

P. Maigne, M. Gendry, T. Venet, Y. Tahri, and G. Hollinger, "Measurement of the Extent of Strain Relief in InGaAs Layers Grown Under Tensile Strain on InP(100) Substrates," Appl. Phys. Lett., vol. 69, 1996, pp. 682–684.

X. Wu and G.C. Weatherly, "Cracking Phenomena In InGaAs Film on InP Substrates," Elsevier Science Ltd. 1999, Acta Matter, vol. 47, No. 12, pp. 3383–3394.

Wang Xiaoliang, Sun Dianzhao, Kong Meiying, Hou Xun, Zeng Yiping, "GSMBE Growth and Charaterization of InGa–As/InP Strained–Layer MQW's in a P–i–N Configuration," Elsevier Science B.V. 1997, Journal of Crystal Growth 175/176, pp. 1254–1258.

Hadis Morkoc, Boris Sverdlov, Guang–Bo Gao, "Strained layer Heterostructures, and Their Applications to MODFET's HBT's, and Lasers," Proceedings of the IEEE—Apr. 4, 1993, vol. 81, No. 4, pp. 493–556.

* cited by examiner

HETEROJUNCTION BIPOLAR TRANSISTOR WITH TENSILE GRADED CARBON-DOPED BASE LAYER GROWN BY MOCVD

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Field of the Invention

The present invention relates in general to high-speed electronic transistor devices, and more specifically to InP/InGaAs Heterojunction Bipolar Transistors (HBT).

2. Description of the Related Art

The emitter injection efficiency of a bipolar transistor is limited by the fact that carriers can flow from the base into the emitter region, over the emitter junction barrier, when the junction is under forward bias. Such transistors use a lightly doped material for the base region and a heavily doped material for the emitter. The requirement of a lightly doped material for the base region results in undesirably high base resistances and a thick base region. It is known that for high frequency applications it is desirable to have a thin, heavily doped base and a lightly doped emitter. One solution is the heterojunction bipolar transistor. In these transistors the emitter injection efficiency can be increased without strict requirements on doping. Materials commonly used in heterojunction bipolar transistors include the aluminum galium arsenide/galium arsenide (AlGaAs/GaAs) system because of the wide range of lattice matched compositions. It is also known to use a system where indium galium arsenide phosphide (InGaAsP) is grown on indium phosphide (InP).

Lattice matching is well known in the art and refers to matching of the lattice structure and lattice constant for two materials, for example galium arsenide and aluminum arsenide. Special consideration must be taken when depositing a material that has a lattice constant that is significantly different than the material on which it is being deposited. In the prior art, it is known that a thin layer is in compression or tension along the surface plane as its lattice constant adapts to the seed crystal. When this layer is grown very thick however, the layer eventually cannot maintain the compression or tension strain and it will relieve the strain by relaxing. It relaxes to its natural lattice constant. This is the difference between a relaxed layer and a strained layer. The thickness at which a layer begins to relax is referred to as the critical thickness and it depends on the difference in the lattice parameter of the two materials. For indium galium arsenide on indium phosphide there is only one composition of indium galium arsenide that is exactly lattice matched. Since it is very difficult to get the exact match during crystal growth, it is considered in the prior art that if the perpendicular mismatch is less than 0.2%, then the layers are considered to be lattice matched.

In the prior art galium arsenide grown on aluminum arsenide provided a large change in the band gap between the materials with little change in the lattice constant. Because they have similar lattice constants, they are thus easily grown. The system allows for band gap engineering without a designer being constrained by excessive strain or lattice relaxation since the mismatch was just less than 0.2%.

These materials such as described above allow for band gap engineering, which results in various types of desirable devices. In prior art typical heterojunction bipolar transistors are nominally lattice matched to the substrate lattice constant to avoid defects, stress and relaxation of the base material. These effects are harmful to the performance of heterojunction bipolar transistors and limit band gap engineering. Band gap engineering is used to design devices for different optical effects and electronic effects. The heterojunction bipolar transistor may be formed using MOVCD (Metal Organic Chemical Vapor Deposition), a materials science technology used for growing compound semiconductor-based epitaxial wafers and devices. MOCVD technology is also known as OMVPE (Organo-Metal Vapor Phase Epitaxy) and MOVPE (Metal Organic Vapor Phase Epitaxy). Various epitaxial growth techniques are known in the prior art and include LPE (Liquid Phase Epitaxy) VPE (Vapor Phase Epitaxy) and MBE (Molecular Beam Epitaxy). MOCVD is a dominant growth technique behind the major devices and a popular choice of manufacturers involved in high volume production of epitaxial wafers and devices.

It is a drawback of the prior art that the lattice mismatch is to be kept less than 0.2% and thus there is a need in the prior art for a system for band gap engineering, which provides for devices having greater than 0.2% lattice mismatch.

SUMMARY OF THE INVENTION

In general terms the present invention is a heterojunction bipolar transistor (HBT), having a substrate formed of indium phosphide (InP), and having emitter, base and collector layers formed over the substrate such that the base layer is disposed between the emitter and collector layers. In one embodiment, the collector layer is formed from InGaAs and is doped n-type. The emitter layer is formed from InP and is doped n-type. The base layer is formed of indium gallium arsenide (InGaAs) and is doped p-type. The composition of the base layer is graded from $In_xGa_{1-x}As$ to $In_yGa_{1-y}As$, where x is less than 0.515 and where y is less than 0.53 and less than x.

In the present invention the base layer is only under tensile strain as opposed to similar grading techniques, which use a "strain compensated" grading technique in which the graded layer is partially tensile strained and partially compressively strained. An X-ray rocking curve of the heterojunction bipolar transistor shows that the base material has a varying lattice constant as indicated by the broad curve on the x-ray scan. More specifically, the heterojunction bipolar transistor has a carbon doped tensile strained graded base layer grown by MOCVD.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DETAILED DESCRIPTION OF THE PREFERRED EMBODIMENTS

Figure 1:
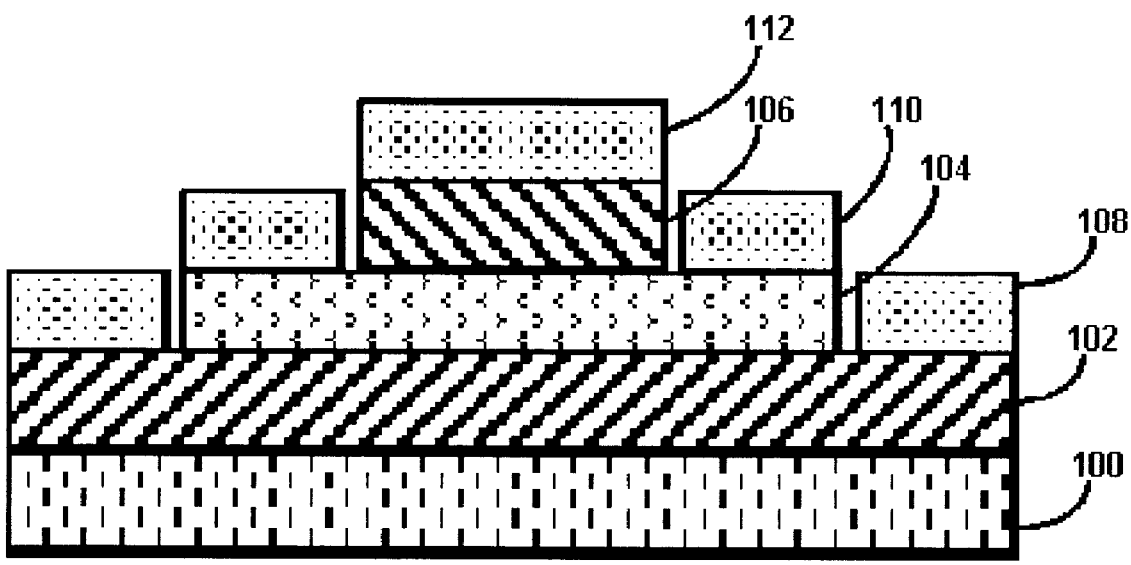
FIG. 1 is a cross sectional view of a heterojunction bipolar transistor according to the present invention.

FIG. 1 is a cross-sectional view of a heterojunction bipolar transistor constructed according to the present invention. As depicted in FIG. 1, a substrate 100 (such as formed of InP) has a collector 102 on a first surface thereof.

On the collector 102 is a base 104, and on the base 104 is an emitter 106. Each of the collector 102, the base 104 and the emitter 106 has respective metallic contacts 108, 110 and 112. Although the collector layer 102 is shown in FIG. 1 as being disposed between the base layer 104 and the substrate 100, it is within the scope of the present invention to reverse the positions of the collector 102 and the emitter 106. The heterojunction bipolar transistor depicted in FIG. 1 may be fabricated using conventional technology as is known in the art.

The substrate 100, the collector layer 102, the base layer 104 and the emitter layer 106 have the following thicknesses in one embodiment of the present invention:

Substrate layer 100 is in the range of 200 nm to 1000 nm;
Collector layer 102 is in the range of 100 nm to 50000 nm;
Base layer 104 is in the range of 10 nm to 200 nm; and
Emitter layer 106 is in the range of 20 nm to 200 nm.

Figure 2:
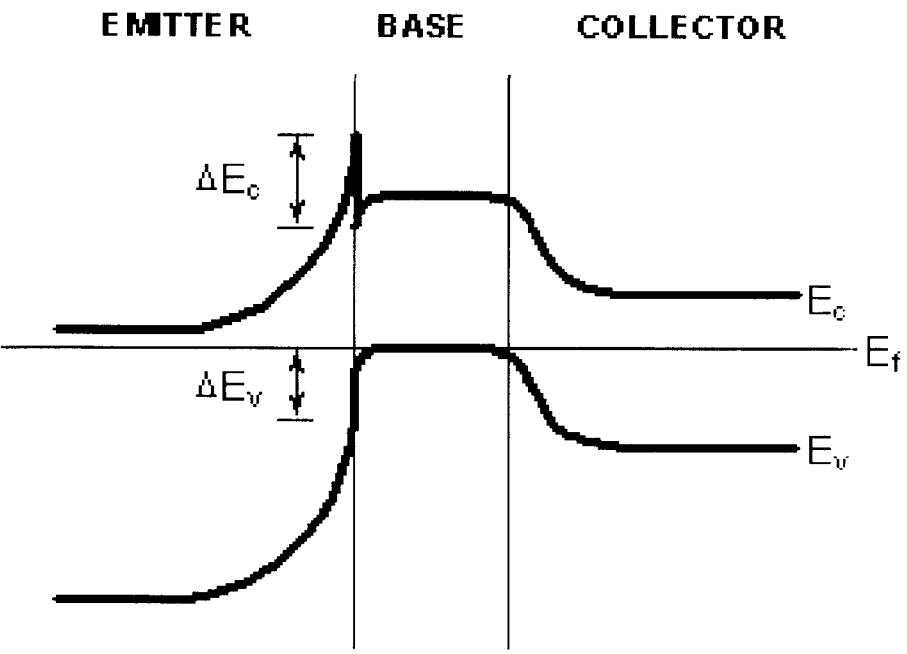
FIG. 2 is an energy band diagram for a prior art heterojunction bipolar transistor.

FIG. 2 depicts a typical prior art heterojunction bipolar transistor in terms of an energy band diagram. The energy band diagram is for a standard InP/InGaAs heterojunction bipolar transistor. For an InP emitter layer the $\Delta E_c$ is around 240 mV and the $\Delta E_v$ is around 330 mV. For an InAlAs emitter layer the $\Delta E_c$ is around 460 mV and the $\Delta E_v$ is around 200 mV. The $\Delta E_c$ is the conductive band continuity, and the $\Delta E_v$ is the valance band conductivity and $\Delta E_c$ and $\Delta E_v$ are referenced to the equilibrium fermi level $E_f$.

Figure 3:
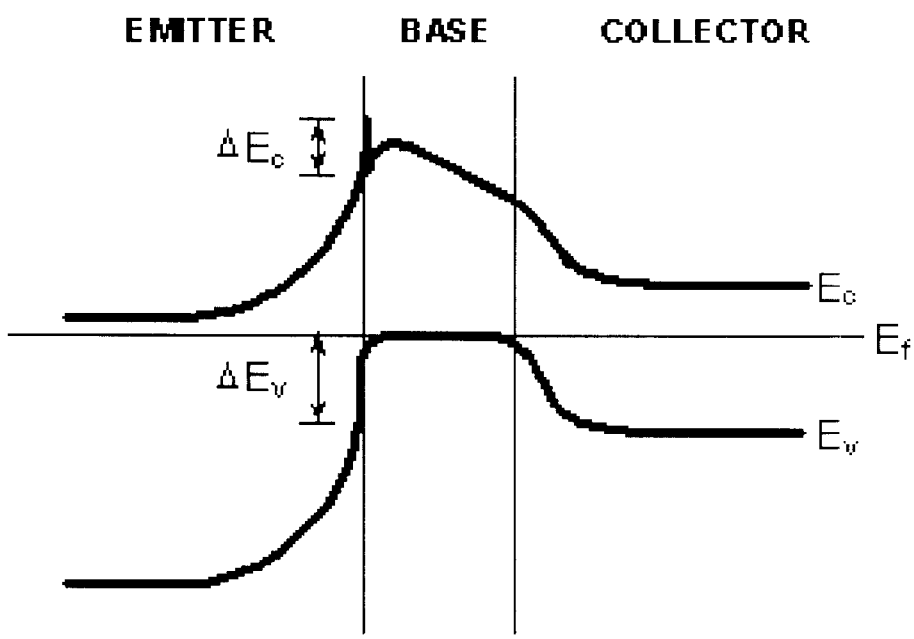
FIG. 3 is an energy band diagram for a heterojunction bipolar transistor according to the present invention.

FIG. 3 depicts an energy band diagram for the carbon doped tensile strained graded base layer of the heterojunction bipolar transistor of the present invention. As can be seen from the FIG. 3 diagram the gallium mole fraction and the band gap of the base layer decrease from the emitterbase junction to the base collector junction. The $\Delta E_c$ at the emitter base junction is smaller than that compared with the standard lattice matched structure as depicted in FIG. 2. A heterojunction can also form at the base-collector junction if the galium mole fraction at the base collector junction remains greater than 0.47. The size of the heterojunction discontinuities at the emitter base and collector base junctions depends on the exact composition of the base layer at those junctions.

The novelty of the use of a tensile strained, carbon-doped InP/InGaAs HBT grown by MOCVD is that the device speed can be improved without sacrificing carbon-doping efficiency. Prior art graded bases are known to improve base transit time. However, for MOCVD grown layers, high carbon-doping levels are difficult to achieve because carbon doping efficiency decreases with gallium mole fraction. By employing a tensile graded layer rather than a strain compensated layer or compressively graded base, the carbon-doping efficiency is maximized while decreasing the base transit time. The potential drawback to this method is this type of graded layer will have a higher net strain component than in the strain compensated technique. A common assumption is that this high strain will result in defects or misfit dislocations that degrade the base material and the device performance. To the contrary, the novelty of this invention is that highly mismatched, graded-base devices can be made with excellent device performance. This allows a carbon-doped, graded-base device to be employed in InP/InGaAs HBTs grown by MOCVD with negligible impact on the base doping level and base resistance.

Figure 4:
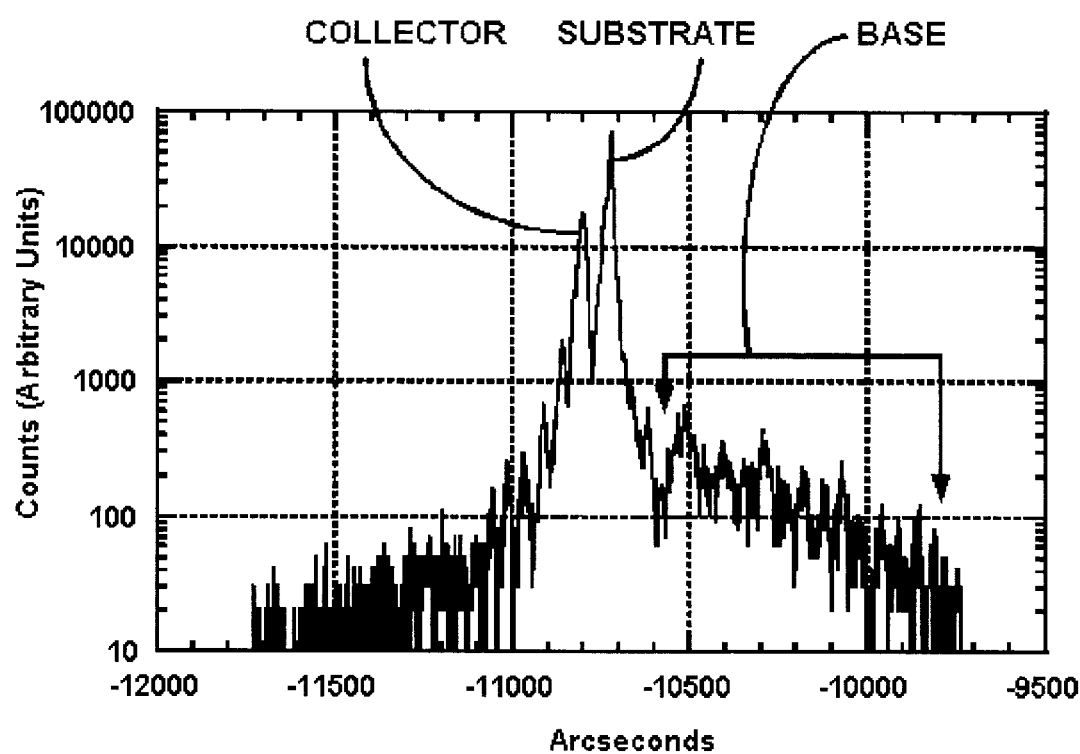
FIG. 4 is an X-ray rocking curve of the FIG. 3 heterojunction bipolar transistor of the present invention.

FIG. 4 is an X-ray rocking curve of the InP/InGaAs HBT with the tensile graded base. The base layer displays a graded layer starting about 900 arcseconds from the substrate peak and ending about 200 arcseconds away from the substrate peak. The measurement was taken of the (004) symmetric reflection using the double crystal x-ray diffraction technique and the Cu Kα x-ray emission. The splitting corresponds to a grading of the base layer lattice constant from approximately 5.8310 angstroms to 5.8600 angstroms (the lattice constant of the InP substrate is 5.8688 angstroms). Assuming the layer is fully strained, the corresponding compositional grade is from $In_{0.52}Ga_{0.48}As$ at the base collector junction to $In_{0.48}Ga_{0.52}As$ at the emitter base junction. The collector layer is slightly mismatched from the substrate as is indicated in FIG. 4.

Using a graded base the transit time of the minority carriers across the base region is decreased. This improves the current gain and increases the operating speed of the device. The present invention provides the important features of a specific type of grade (tensile) and the growth technique used to accomplish the fabrication of the device (MOCVD). Using a tensile grade, as x decreases, carbon is incorporated increasingly in the $In_xGa_{1-x}As$ layer. This is important because it is typically very difficult to get high active carbon concentrations in this layer using MOCVD. For heterojunction bipolar transistors with a carbon doped base, the advantage is to maintain high carbon doping in the base region while accomplishing a grade in the composition of the base material. Since carbon doping becomes less efficient and carbon becomes less active as a p-type dopant as the layer decreases in gallium composition, maximizing the gallium composition is important in maximizing the base doping level. For carbon doped devices, the tensile strained base is a better approach than even though it introduces more strain in the strained compensated approach. As long as the strain is not too high to cause catastrophic defect formation, a tensile graded base results in the benefits of the graded base technology without significantly degrading the basehole concentration and the base resistance. Compared with non-graded layers, the lower indium composition at the emitter-base junction results in a higher band gap that increases the band gap of the base and will reduce the size of the heterojunction discontinuity. This in turn decreases the offset voltage. The strain itself alters the charge transport characteristics of the device by changing the characteristics of the valance and conduction band. For instance, the strain will induce a separation of the light and heavy hole valence bands and improve the carrier transport in the base region.

The invention is not limited to the particular details of the apparatus depicted and other modifications and applications are contemplated. Certain other changes may be made in the above described apparatus without departing from the true spirit and scope of the invention herein involved. Also encompassed by the present invention are InAlAs/InGaAs heterojunction bipolar transistors in which the InP emitter layer is replaced with InAlAs or InAlGaAs. Double heterojunction devices in which the InGaAs collector material is completely or partially replaced with a wider bandgap material like InP, InGaAsP, InAlAs or InAlGaAs are also comtemplated. Different base material such as GaAsSb is also contemplated by the present invention.It is intended, therefore, that the subject matter in the above depiction shall be interpreted as illustrative and not in a limiting sense.

I claim:

1. A heterojunction bipolar transistor (HBT), comprising:
   a substrate formed of indium phosphide (InP);
   emitter, base and collector layers formed over the substrate such that the base layer is disposed between the emitter and collector layers;
   the collector layer formed from InGaAs, and the collector layer being doped n-type;

the emitter layer formed from InP, and the emitter layer being doped n-type;

the base layer formed from $In_xGa_{1-x}As$ (indium gallium arsenide) and grown by MOCVD, the base layer being doped p-type with carbon; and the base layer having a tensile grade such that as x decreases across the base layer from the collector layer to the emitter layer.

2. The heterojunction bipolar transistor according to claim 1, wherein the HBT is npn-type.

3. The heterojunction bipolar transistor according to claim 1, wherein the composition of the base layer is graded from $In_xGa_{1-x}As$ to $In_yGa_{1-y}As$, where x is less than 0.515 and where y is less than 0.53 and less than x.

4. The heterojunction bipolar transistor according to claim 1, wherein the collector layer is disposed between the substrate and the base layer.

5. The heterojunction bipolar transistor according to claim 1, wherein in an x-ray rocking curve of the heterojunction bipolar transistor, the base layer displays a graded layer beginning at about 900 arcseconds from a peak corresponding to the substrate layer and ending at about 200 arcseconds from the peak corresponding to the substrate layer.

6. The heterojunction bipolar transistor according to claim 1, wherein a lattice constant of the base layer is substantially smaller than a lattice constant of the substrate in at least a portion of a base region of the base layer.

7. A heterojunction bipolar transistor (HBT), comprising:

a substrate formed of indium phosphide (InP);

emitter, base and collector layers formed over the substrate such that the base layer is disposed between the emitter and collector layers;

the collector layer formed from indium gallium arsenide (InGaAs), and the collector layer being doped n-type;

the emitter layer formed from InP, and the emitter layer being doped n-type;

the base layer formed of InGaAs and grown by MOCVD, the base layer being graded and carbon doped p-type; and the base layer displaying a graded layer beginning at about 900 arcseconds from a peak corresponding to the substrate layer and ending at about 200 arcseconds from the peak corresponding to the substrate layer.

8. The heterojunction bipolar transistor according to claim 7, wherein the base layer is formed from $In_xGa_{1-x}As$ where x is less than about 0.515, and wherein the base layer has a tensile grade such that as x decreases across the base layer, carbon is increasingly incorporated in the base layer.

9. The heterojunction bipolar transistor according to claim 7, wherein the collector layer is disposed between the substrate and the base layer.

10. The heterojunction bipolar transistor according to claim 7, wherein a percentage of indium in at least a portion of the base layer is less than 51.5%.

11. The heterojunction bipolar transistor according to claim 7, wherein a lattice constant of the base layer is substantially smaller than a lattice constant of the substrate in at least a potion of a base region of the base layer.

12. A heterojunction bipolar transistor (HBT), comprising:

a substrate formed of indium phosphide (InP);

emitter, base and collector layers formed over the substrate such that the base layer is disposed between the emitter and collector layers;

the collector layer formed from indium gallium arsenide (InGaAs), and the collector layer being doped n-type;

the emitter layer formed from InP, and the emitter layer being doped n-type;

the base layer formed from InGaAs and grown by MOCVD, the base layer being doped p-type with carbon; and the base layer being graded from $In_xGa_{1-x}As$ to $In_yGa_{1-y}As$, where x is less than 0.515 and where y is less than 0.53 and less than x.

13. The heterojunction bipolar transistor according to claim 12, wherein the collector layer is disposed between the substrate and the base layer.

14. The heterojunction bipolar transistor according to claim 12, wherein in an x-ray rocking curve of the heterojunction bipolar transistor, the base layer displays a graded layer beginning at about 900 arcseconds from a peak corresponding to the substrate layer and ending at about 200 arcseconds from the peak corresponding to the substrate layer.

15. The heterojunction bipolar transistor according to claim 12, wherein a lattice constant of the base layer is substantially smaller than a lattice constant of the substrate in at least a portion of a base region of the base layer.

16. A heterojunction bipolar transistor (HBT), comprising:

a substrate formed of indium phosphide (InP);

emitter, base and collector layers formed over the substrate such that the base layer is disposed between the emitter and collector layers;

the collector layer formed from indium gallium arsenide (InGaAs), and the collector layer being doped n-type;

the emitter layer formed from InP, and the emitter layer being doped n-type;

the base layer formed of InGaAs and grown by MOCVD, the base layer being tensile strained and graded, and the base layer being doped p-type; and a lattice parameter of the base layer being graded from approximately 5.83 angstroms to approximately 5.86 angstroms.

17. The heterojunction bipolar transistor according to claim 16, wherein the collector layer is disposed between the substrate and the base layer.

18. The heterojunction bipolar transistor according to claim 16, wherein in an x-ray rocking curve of the heterojunction bipolar transistor, the base layer displays a graded layer beginning at about 900 arcseconds from a peak corresponding to the substrate layer and ending at about 200 arcseconds from the peak corresponding to the substrate layer.

19. The heterojunction bipolar transistor according to claim 16, wherein the base layer is formed from $In_xGa_{1-x}As$ where x is less than about 0.515, and wherein the base layer has a tensile grade such that as x decreases across the base layer, carbon is increasingly incorporated in the base layer.

20. The heterojunction bipolar transistor according to claim 16, wherein the base layer is formed from $In_xGa_{1-x}As$ where x is less than about 0.515, and wherein the base layer has a tensile grade such that as x decreases across the base layer.

* * * * *